United States Patent
Wang

(10) Patent No.: US 6,693,967 B1
(45) Date of Patent: Feb. 17, 2004

(54) DETECTING ENCODING AND ENCODING CONVERSION FOR MODEM CONNECTIONS

(75) Inventor: Zhenyu Wang, Morganville, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/527,011

(22) Filed: Mar. 16, 2000

(51) Int. Cl.[7] .................. H04B 17/00; H04B 3/46; H04Q 1/20
(52) U.S. Cl. .................. 375/242; 375/224; 375/286
(58) Field of Search .................. 375/242, 222, 375/243, 254, 249, 286, 287, 224, 264, 288, 259

(56) References Cited

U.S. PATENT DOCUMENTS

| | | | |
|---|---|---|---|
| 5,825,823 A | | 10/1998 | Goldstein et al. |
| 6,381,266 B1 | * | 4/2002 | Zhang et al. ............. 375/222 |
| 6,404,809 B1 | * | 6/2002 | Zhang ..................... 375/232 |
| 6,549,569 B1 | * | 4/2003 | Beyda et al. ............ 375/242 |

FOREIGN PATENT DOCUMENTS

| | | |
|---|---|---|
| GB | 1572582 | 2/1978 |
| JP | 070086958 | 3/1995 |
| WO | WO 00/45524 | 8/2000 |

* cited by examiner

*Primary Examiner*—Jean B. Corrielus
(74) *Attorney, Agent, or Firm*—Steve Mendelsohn; Ian M. Hughes

(57) ABSTRACT

A first transceiver transmits a set of test levels to a second transceiver through a communication channel in which one or more types of companding laws are used for line encoding. The second transceiver determines line encoding with, and conversion between, the companding laws present in the communication channel based on the received set of test signals. The set of test levels are signals having levels determined based on the difference between the normalized amplitude, vertex, or energy curves for the types of companding laws, with or without accounting for other sources of network distortion. A decision metric is also generated from the difference between the normalized amplitude, vertex, or energy curves for the types of companding laws. The second transceiver then compares a combination of the set of test levels that is received from the communication channel with the decision metric. Line encoding and encoding conversion in accordance with the one or more types of companding laws is detected based on the comparison with the decision metric.

44 Claims, 8 Drawing Sheets

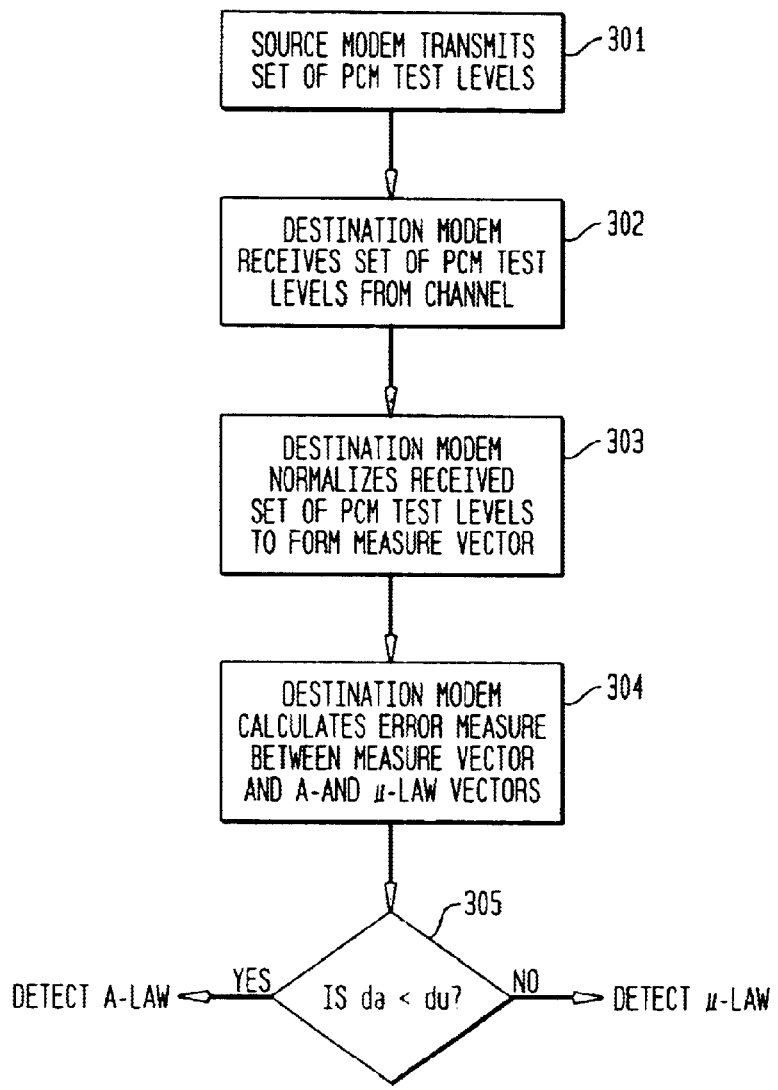

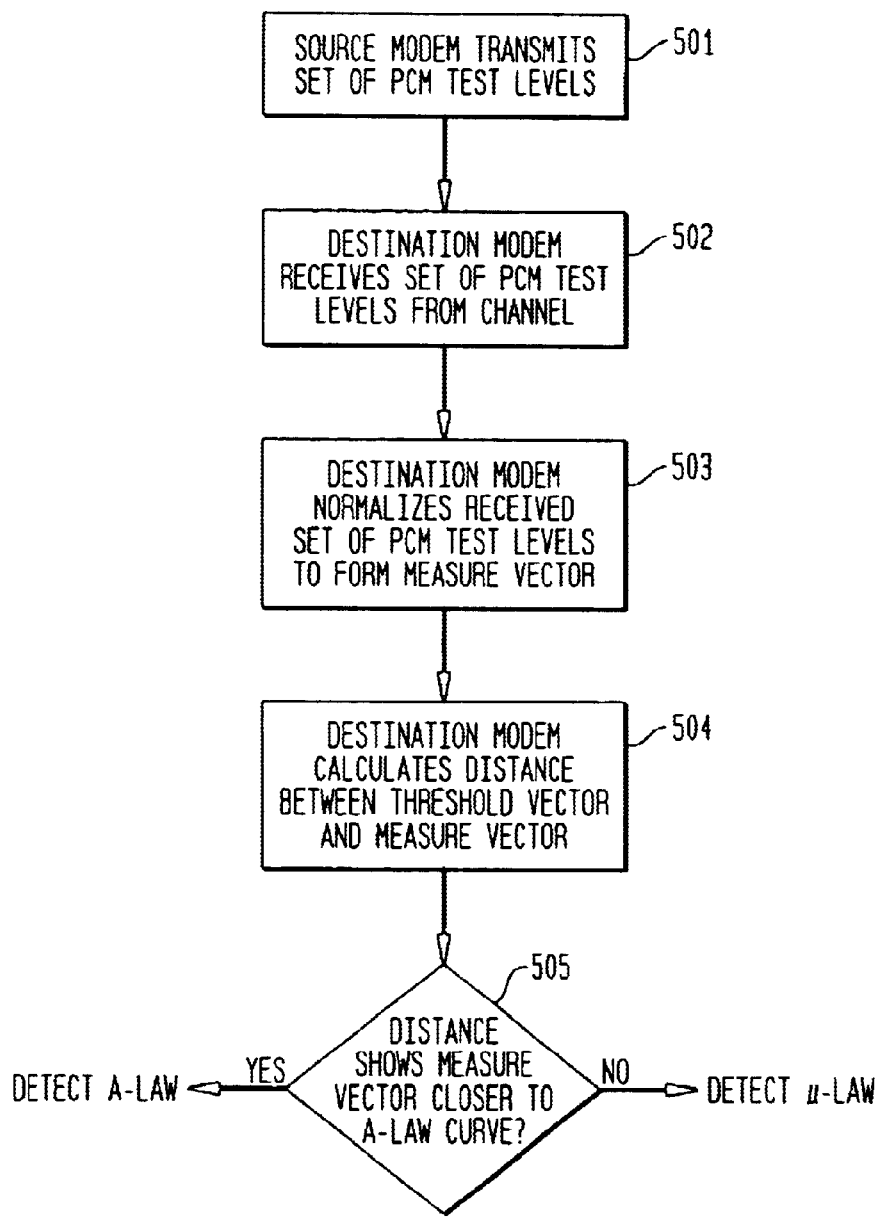

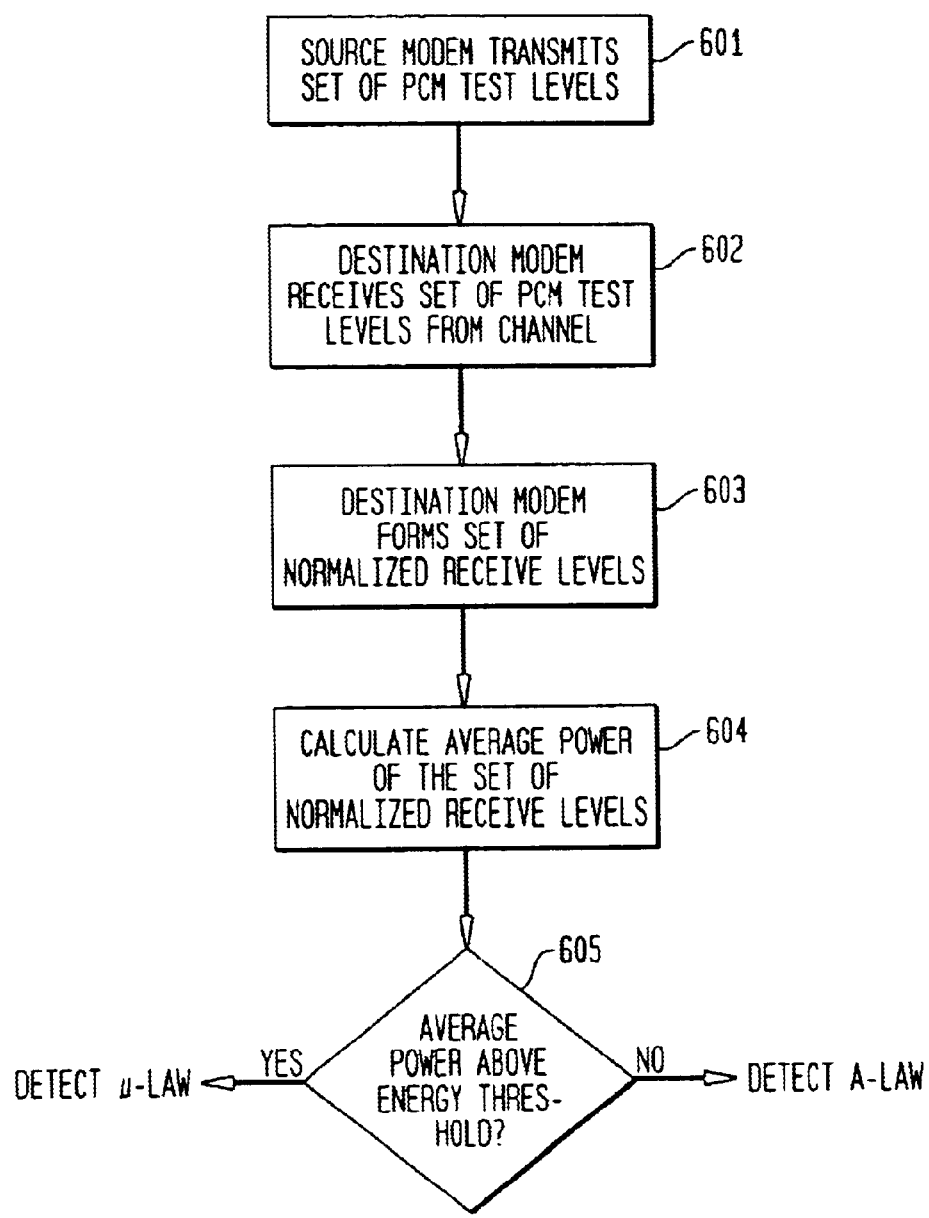

DETECTING ENCODING AND ENCODING CONVERSION FOR MODEM CONNECTIONS

CROSS-REFERENCE TO RELATED APPLICATIONS

This application is related to Ser. Nos. 09/527,008 and 09/527,009 U.S. patent applications, filed Mar. 16, 2000, the teachings of which are incorporated herein by reference. This application is also related to U.S. patent application Ser. No. 09/296,516 filed Apr. 22, 1999, now U.S. Pat. No. 6,523,233, the teachings of which are also incorporated herein by reference.

BACKGROUND OF THE INVENTION

1. Field of the Invention

The present invention relates to transmission of encoded data in a telecommunications system, and, more particularly, to detection of telecommunication line encoding and encoding conversion for data connections.

2. Description of the Related Art

Telecommunication systems commonly employ modulation and encoding of analog signals prior to transmission through a network. Such analog signals are typically voice or voiceband data signals. Voice signals are generated by modulating an electrical signal by the acoustic (voice) signal, while voiceband data signals are generated by modulating an electrical signal such as a carrier with the data. Pulse modulation may then be employed to combine the analog signal with discrete, unit-amplitude pulses before transmission over a telecommunication channel. In pulse amplitude modulation (PAM), the analog signal varies the amplitude of the discrete, unit-amplitude pulses, while, in pulse width modulation (PWM), the analog signal varies the length, in time, of the discrete, unit-amplitude pulses. The original pulse stream is relatively easy for a receiver to detect and regenerate from the signals received from an ideal telecommunication channel. However, since noise and line attenuation/distortion of a real transmission medium (also called the channel response) alters the pulse-modulated signal as it passes through the medium, telecommunication systems typically employ digital transmission techniques. One such digital transmission technique is pulse code modulation (PCM), in which the analog signal is sampled and quantized using discrete digital levels. Typically, $2^n$ discrete levels are employed in telecommunication systems (e.g., using 8 bits, n=8, allowing for 256 discrete levels, with the distance between levels termed quantizing steps).

For a given method of quantizing, each sample of the analog signal is approximated to the nearest discrete level, and the digital value representing the level is transmitted to the receiver. However, since the amplitude of the analog signal and the discrete level of PCM are usually not the same value, the difference between the amplitude of the analog signal and the discrete level of PCM, termed the quantizing error, introduces additional noise into the transmitted signal. This quantizing error introduces noise into the subsequently reconstructed voice or voiceband data signal at the receiver. For PCM using linear quantizing, the increments between the discrete levels are the same (i.e., the quantizing steps are equivalent). However, for linear quantizing, the quantizing noise is not uniform for all analog signal amplitudes because the low amplitude signals experience larger quantizing noise than the high amplitude signals. Consequently, linear quantizing for signals with high dynamic range but with a high percentage of low amplitude signal (such as encoded speech) has a relatively low (poor) signal-to-quantization noise ratio.

Non-linear quantizing with tapered quantizing steps may be employed to compensate for the poor signal-to-quantization noise ratio of linear quantizing. Equivalently, the input signal may be weighted and linear quantizing to achieve the same result. This non-uniform predistortion process, termed companding, compresses larger signal amplitudes, and a receiver then reverses the companding process. Telecommunication systems typically employ a logarithmic companding law. In some countries, such as the United States, PCM line encoding of an analog signal employs a companding function, termed $\mu$-law, as given in equation (1):

$$e_O = \frac{\log(1 + \mu e_i)}{\log(1 + \mu)} \quad 0 \le e_i \le 1 \tag{1}$$

where $e_o$ is the output signal value, $e_i$ is the normalized input signal value, and $\mu$ is a constant. Other countries, such as Europe, employ a different companding function, termed A-law, and are given in equation (2):

$$e_O = \begin{cases} \dfrac{Ae_i}{1 + \log(A)} & \text{if } 0 \le e_i \le \dfrac{1}{A} \\ \dfrac{1 + \log(Ae_i)}{1 + \log(A)} & \text{if } \dfrac{1}{A} \le e_i \le 1 \end{cases} \tag{2}$$

where $e_o$ is the output signal value, $e_i$ is the normalized input signal value, and A is a constant greater than 1. Since voice and voiceband data signals are often transmitted between different systems using either $\mu$-law or A-law, telecommunication networks provide for reformatting (encoding conversion) between the two companding functions.

Encoding conversion may be between networks employing A-law encoding and networks employing $\mu$-law encoding. Such encoding conversion may be implemented within a network as a simple mapping between A-law and $\mu$-law levels (i.e., a mapping between A-law and $\mu$-law encoded sample values). As would be apparent to one skilled in the art, such mapping may add signal distortion from quantization error. For example, during an initial encoding, samples of an analog signal may be mapped to corresponding $\mu$-law levels, which are subsequently mapped to A-law levels during encoding conversion. Since A-law encoding and $\mu$-law encoding are non-linear companding methods, two $\mu$-law levels may map to the same A-law level. Consequently, quantization error may be added to the original signal reconstructed from the sequence of A-law levels when certain $\mu$-law quantizing level information is lost.

For PCM systems in some countries, such as the United States, voice or voiceband data channels are subject to PCM encoding and grouped by time multiplexing into twenty-four 8-bit channels (192 bits). One framing bit is appended to this group of 192 bits to form a T1 format of 193 bits/frame. The pattern of framing bits received over several frames (e.g., twelve T1 frames) may be employed for T1 line framing and timing synchronization, as well as for line bit error rate (BER) calculation. The voice and voiceband data signals are typically sampled at 8 kHz, so each T1 frame is transmitted at 1.544 Mb/sec. Similar formats exist in other countries, such as the E1 frame comprising thirty 8-bit channels plus framing bits transmitted at 2.048 Mb/sec. Signaling for set-up/tear-down of connections, or other slow-speed network data channels, may be superimposed on the T1 frame (termed herein as "superimposed information channels"). For example, for robbed-bit signaling (RBS), a low-rate signaling channel may be formed by replacing the least significant bit (LSB) of each 8-bit channel with a signaling bit of the low-rate signaling channel for every sixth T1 frame transmitted. For RBS using two signaling bits, the period of the RBS information channel is twelve T1 frames. For RBS using four signaling bits, the period of the RBS information channel is twenty-four T1 frames (the pattern of T1 framing bits over twenty-four frames also defines a T1 superframe).

SUMMARY OF THE INVENTION

The present invention relates to detection of transmission line characteristics of a telecommunication channel, such as the companding law used for line encoding, conversion between line encodings having different companding laws, superimposed information channels, or line attenuation, between a pair of transceivers. Such detection may be accomplished through a set of test levels that are transmitted from one transceiver to the other transceiver of the pair. The transceiver receiving the set of test levels transmitted through the telecommunication channel compares normalized received test levels with expected, normalized, ideal values to detect one or more of the transmission line characteristics. Analog signal levels used for the test levels are determined based on the detected line encoding companding laws and the particular transmission line characteristic to be detected (e.g., RBS, line attenuation). The transceiver receiving the set of test levels and detecting the line encoding and other transmission line characteristics may then correct for distortion of signals caused by the detected transmission line characteristics. Correcting for distortion allows for higher received signal to noise ratio, lower bit error rate, and higher data rate transmission between the pair of transceivers.

In accordance with embodiments of the present invention, line encoding in accordance with one of a plurality of encoding algorithms is detected in a signal transmitted through a telecommunication channel. The signal is generated and comprises a set of test levels, wherein each of the test levels is selected based on the relative difference between each of the plurality of encoding algorithms when encoding the test level, and all of the encoding algorithms encode one of the test levels to generate a substantially equivalent value. A combination of the test levels transmitted through the communication channel is compared to a decision metric, wherein the decision metric is based on a measure of the difference between one or more of the set of test levels prior to being transmitted through the communication channel to the corresponding one or more of the set of test levels after the signal is transmitted through the communication channel. The one test level is employed to normalize the remaining test levels for the comparison. The line encoding is detected according to one of the encoding algorithms based on the comparison of the combination with the decision metric.

BRIEF DESCRIPTION OF THE DRAWINGS

Other aspects, features, and advantages of the present invention will become more fully apparent from the following detailed description, the appended claims, and the accompanying drawings in which:

FIG. 3 shows an exemplary method of determining $\mu$-law or A-law line encoding employing the graph of FIG. 2;

FIG. 5 shows an exemplary method of determining line encoding based on distance measure comparison and employing the graph of FIG. 4;

FIG. 6 shows an exemplary method of determining line encoding based on energy detection under $\mu$-law and A-law vertex curves for a third exemplary implementation of the present invention;

DETAILED DESCRIPTION

Figure 1:
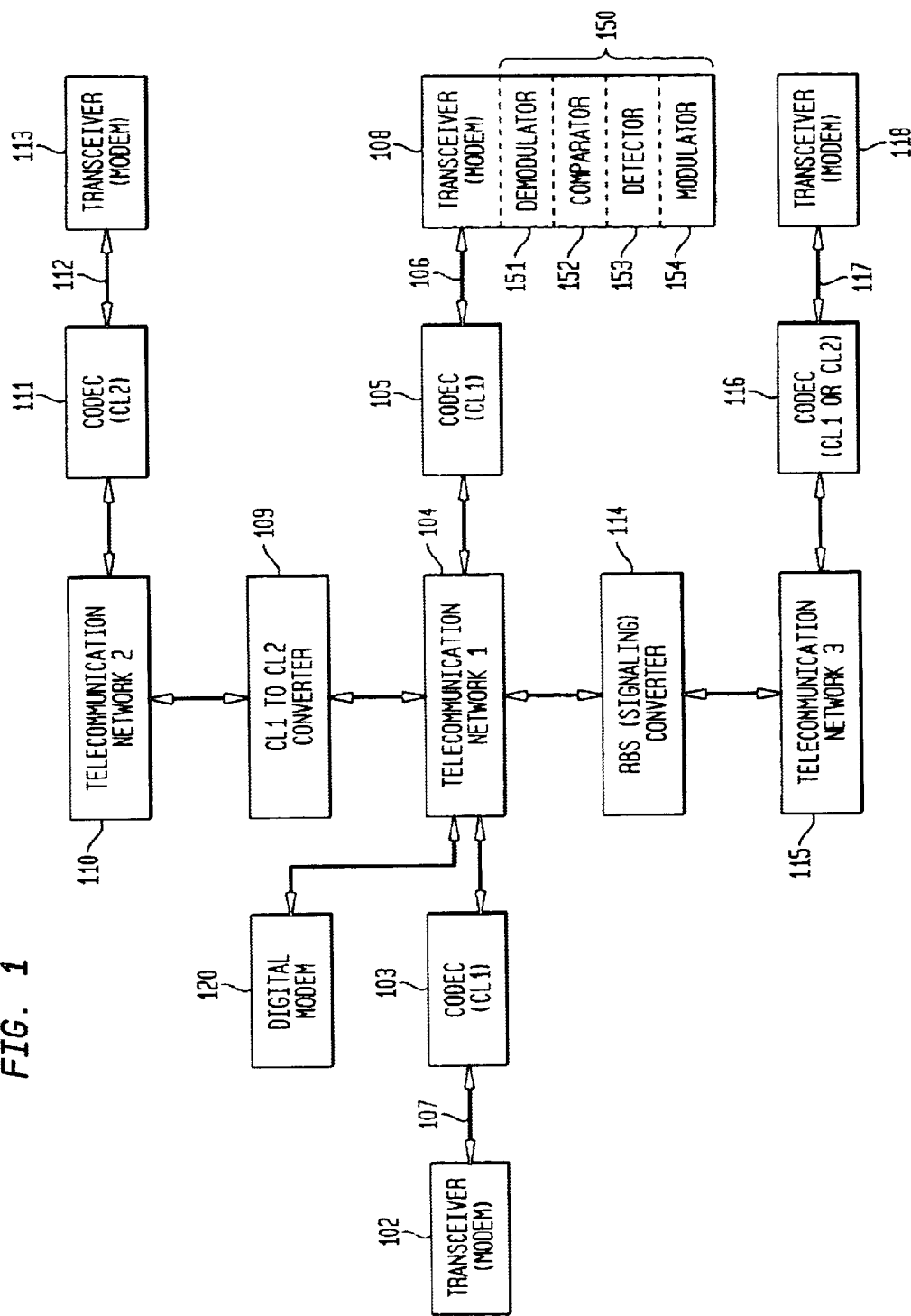
FIG. 1 shows a system of interconnected transceivers, such as modems, employing exemplary embodiments of the present invention.

FIG. 1 illustrates several different types of network connections having transceivers operating in accordance with one or more embodiments of the present invention. A first transceiver 102 communicates with one or more of transceivers 108, 113, and 118, although one skilled in the art would realize that any number of other connections may be possible. Transceivers 102, 108, 113, and 118 are generally capable of bi-directional communication with each other. For the following described embodiments, communication is described in the forward direction from a source (e.g., first transceiver 102 transmits a signal) to a destination (e.g., the other transceivers 108, 113, and 118 receive the signal). As would be apparent to one skilled in the art, communication in the reverse direction may be accomplished in an analogous manner.

For the telecommunication system shown in FIG. 1, transceivers 102, 108, 113, and 118 are generally customer premise equipment, such as modems. Also for telecommunication systems, the communication over line 107 with codec 103, over line 106 between transceiver 102 and codec 105, over line 112 between transceiver 113 and with codec 111, and over line 117 between transceiver 118 and with codec 116 may each define a separate subscriber loop. Each modem includes a processor or other circuitry for modulating (demodulating) a signal to generate (receive) transmitted data and test levels. For example, processor 150 of transceiver 108 includes a demodulator 151 and modulator 154. Processor 150 also includes comparator 152 to generate a comparison of combinations of test levels with a decision metric and detector 153 to detect transmission characteristics. These functions associated with comparator 152 and detector 153 are described subsequently for exemplary implementations of the present invention.

In the first connection, transceiver 102 communicates with second transceiver 108. Codec 103 encodes the voice-band data signal in accordance with first companding law CL1 (first line encoding), such as $\mu$-law pulse code modulation (PCM). The encoded signal from codec 103 is in turn provided to first telecommunication network 104. The encoded signal from first telecommunication network 104 is provided to codec 105. Codec 105 supports the first line encoding and reverses the encoding in accordance with the first companding law CL1 to generate a reconstructed analog signal provided to the second transceiver 108 over analog line 106. The analog signal from first transceiver 102 may be subject to line attenuation or distortion when passing over analog line 107. The analog signal from codec 105 to second transceiver 108 may be also subject to line attenuation or distortion when passing over analog line 106. First transceiver 102 may be a modem generating an analog signal, which may be voiceband data, that is provided to coder/decoder (codec) 103.

In the second connection, transceiver 102 communicates with third transceiver 113. The encoded signal from first telecommunication network 104 is converted by converter 109 from first line encoding in accordance with the first companding law CL1 to second line encoding in accordance with the second companding law CL2. The output signal from converter 109 is provided to second telecommunication network 110. Converter 109 represents the one or more different encoding conversions that may take place between one or more additional networks, and one skilled in the art would recognize that this particular encoding conversion is exemplary only, and that multiple intermediate encoding conversions may alternatively take place. Second telecommunication network 110 supports the second companding law CL2 and provides the encoded signal generated by converter 109 to codec 111. Codec 111 supports line encoding with the second companding law CL2. Codec 111 reverses the encoding in accordance with the second companding law CL2 to generate a reconstructed analog signal provided to the third transceiver 113 over analog line 112. For this second connection, distortion from encoding conversion (109) between different companding laws takes place in the communication channel between telecommunication networks 104 and 110, in addition to any line attenuation or distortion that may be added by analog line 112.

In the third connection, transceiver 102 communicates with fourth transceiver 118. Third telecommunication network 115 supports a superimposed information channel, such as robbed-bit signaling (RBS). First telecommunication network 104 provides the encoded signal generated by transceiver 102 to RBS converter 114 before the encoded signal is passed to the third telecommunication network 115. RBS converter 114 may be a network element that generates and interprets signaling or other connection supervisory information superimposed on the signal transmitted from transceiver 102 that adds distortion to the signal reconstructed by transceiver 118. Third telecommunication network 115, in turn, provides the encoded signal with RBS to codec 116 which reverses the encoding to generate a reconstructed analog signal provided to the fourth transceiver 118 over analog line 117. Codec 116 also generates and interprets signaling or other connection supervisory information.

Also shown in FIG. 1 is digital modem 120. As would be apparent to one skilled in the art, digital modem 120 may perform operations similar to transceiver 102 and codec 103 without requiring an analog signal passing through an analog line such as line 107. While the exemplary embodiments are described using transceivers and codecs, the present invention is not so limited, and digital modem to analog modem, digital modem to digital modem, and analog modem to digital modem communication path connections may exist in a network. Such digital and analog modems may operate in accordance with one or more implementations of the present invention described herein.

In the source and destination transceiver connections of FIG. 1, each of the transceivers 102, 108, 113, and 118 detect line encoding supported by the respective codec (e.g., transceiver 113 detects line encoding between telecommunication network 110 and telecommunication network 110/codec 111). For a first type of connection in FIG. 1, no conversion between different companding laws takes place. The first and second transceivers 102 and 108 establish a communication channel that compensates for line attenuation and distortion, and possibly for distortion introduced by encoding with the particular shared type of companding law (in this case CL1). For a second type of connection, first and third transceivers 102 and 113 detect and compensate for the conversion in line encoding between first and second companding laws CL1 and CL2 codec (e.g., line encoding conversion 109 between telecommunication network 104 and codec 111). For a third connection, superimposed information channel (e.g., robbed-bit signaling or RBS interference) is added in addition to conversion between different companding laws, if required (not shown in FIG. 1), and in addition to any line attenuation and distortion that may occur. For this connection, first and fourth transceivers 102 and 118 detect and compensate for the presence or absence of RBS. In addition, all transceivers 102, 108, 113, and 118 may adjust the signal constellation of the analog signals used to transmit data. Such adjustment of signal constellations may be based on detected line encoding conversion, superimposed information channel interference, and/or line impairments.

For the following description of exemplary embodiments of the present invention, line encoding with the first companding law CL1 is referred to as $\mu$-law encoding, while line encoding with the second companding law CL2 is referred to as A-law encoding. One skilled in the art will readily recognize that these companding laws are exemplary only and the techniques described herein may be extended to networks employing other forms of quantizing or weighting of sampled analog input signals. For example, Type B codecs are also employed, and type B codecs quantize with levels formed from the average between A-law and $\mu$-law companding law levels.

For the following description of exemplary embodiments of the present invention, first transceiver 102 is a source modem employing a set of test levels, such as a set of pulse code modulation (PCM) test levels. The set of test levels is transmitted to a destination modem (e.g., second, third, or fourth transceiver 108, 113, or 118) during a modem training phase. The destination modem receives and measures the transmitted set of PCM test levels to determine if 1) $\mu$-law line encoding or A-law line encoding is present in the subscriber loop; 2) an information channel is superimposed (e.g., RBS is present); and/or 3) the signal is subject to line attenuation. The set of PCM test levels is predefined and generated in accordance with the present invention based on transmission characteristics of the channel and the encoding characteristics of the companding laws. Signal processing by either the source modem, destination modem, or both source and destination modems may employ one or more look-up tables to translate digital sample values of the transmitted or received analog constellation signals into adjusted digital sample values to compensate for distortion.

A pair of transceivers (i.e., two modems in bi-directional communication) operating in accordance with certain implementations of the present invention may detect encoding conversion in the communication channel between the source and destination modems. Such modems may be operating in accordance with a standard, such as the v.90 and v.92 standards, defining training signals, signal constellations, protocols, or other communication channel set-up/supervision information. Referring to FIG. 1, during the training phase for transceivers 102 and 113, first transceiver 102 (acting as a source modem) sends a set of PCM test levels to third transceiver 113 (acting as a destination modem). Third transceiver 113 then detects line encoding between telecommunication network 110 and codec 111 as described subsequently with respect to the exemplary implementations of the present invention. Similarly, during the training phase, third transceiver 113 (acting as a source modem) sends a set of PCM test levels to first transceiver 102 (acting as a destination modem). First transceiver 102 then detects line encoding between telecommunication network 104 and codec 103. After the training phase between the first and third transceivers, they may exchange information about their respective line encoding formats.

Figure 2:
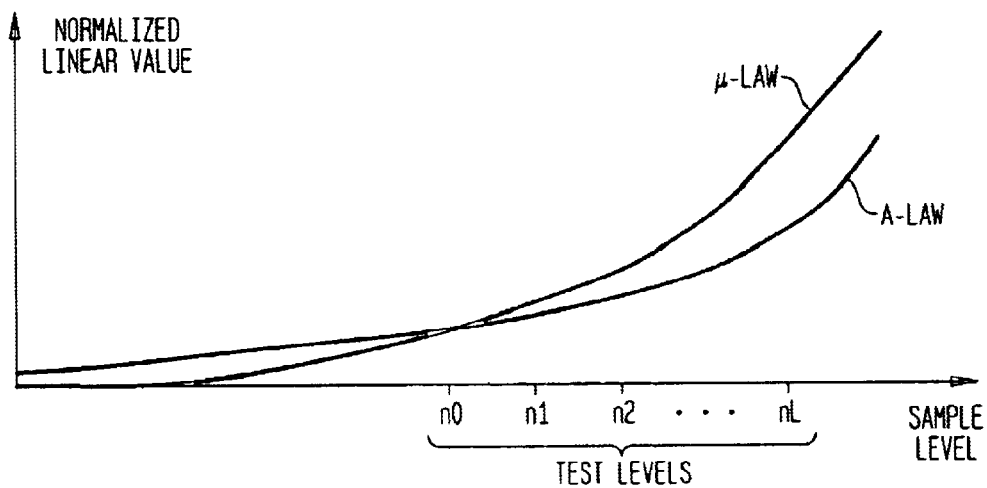
FIG. 2 shows a graph of normalized $\mu$-law and A-law curves versus index value used to define the set of test levels of a first exemplary implementation of the present invention.

For a first implementation, the set of PCM test levels is defined for detecting $\mu$-law encoding or A-law line encoding on a connection between a telecommunication network and a codec. FIG. 2 shows a graph of normalized $\mu$-law and A-law curves versus index value (input signal level) used to define the set of PCM test levels for the first implementation. Each value on the $\mu$-law and A-law curves is the compressed signal level generated by encoding the corresponding index value with the corresponding companding law. The set of PCM test levels includes index values n0 through nL, with n0 being the index value that generates a value common in both $\mu$-law and A-law curves (i.e., the intersection). Each of the remaining set of PCM test levels (n1 through nL) are selected as input sample levels for which there is an increasing difference between the corresponding $\mu$-law and A-law curve values. Some implementations may select input sample levels for which there is a decreasing difference between the corresponding $\mu$-law and A-law curve values, but for these implementations the remaining set of PCM test levels may have low signal-to-noise ratio at a receiver.

Since PCM test level n0 is the input index value that generates the common value both $\mu$-law and A-law curves, a destination modem may employ the received PCM test level x0 corresponding to transmitted PCM test level n0 to normalize other received PCM test levels x1 through xL. The corresponding normalized received levels, denoted y1 through yL, may then be compared to ideal normalized values of the $\mu$-law curve (yu1 through yuL) and to ideal normalized values of the A-law curve (ya1 through yaL) for index values n1–nL to detect whether $\mu$-law or A-law line encoding is used. Modems may then exchange information about detected line encoding at each end of the communication channel to determine if encoding conversion is present.

FIG. 3 shows an exemplary method of determining $\mu$-law encoding or A-law encoding for the first implementation. First, at step 301 the source modem transmits the set of PCM test levels n0 through nL through the communication channel (e.g., over one or more telecommunication networks) to a destination modem. At step 302 the destination modem receives the transmitted set of PCM test levels as received levels x0 through xL. At step 303 the destination modem forms the set of normalized receive levels y1 through yL, where yi is xi/x0 and $1 \leq i \leq L$. The set of normalized receive levels y1 through yL forms a measure vector Ym, where Ym is {y1, y2, . . . , yL}. The set of ideal normalized $\mu$-law curve levels (yu1 through yuL) and the set of ideal normalized A-law curve levels (ya1 through yaL) may form ideal $\mu$-law vector Yu and ideal A-law vector Ya, respectively. The normalized values for ideal $\mu$-law vector Yu and ideal A-law vector Ya are determined by dividing the $\mu$-law and A-law curve levels in FIG. 2 at n1 through nL by the level at n0).

At step 304, the error measure du between the measure vector Ym and the ideal $\mu$-law vector Yu and the error measure da between the measured vector Ym and ideal A-law vector Ya are calculated. For the exemplary embodiment of FIG. 3, the error measure is calculated as the mean squared error (i.e., du=E|Yu−Ym|$^2$ and da=E|Ya−Ym|$^2$, where=E|*| denotes the mathematical term expected value). For a specific implementation, multiple digital samples are taken for each test level, and such calculation may typically be employed in the digital domain. At step 305 the error measures du and da are compared. If da is less than du, then A-law is detected as the line encoding; otherwise, $\mu$-law is detected as the line encoding.

Figure 4:
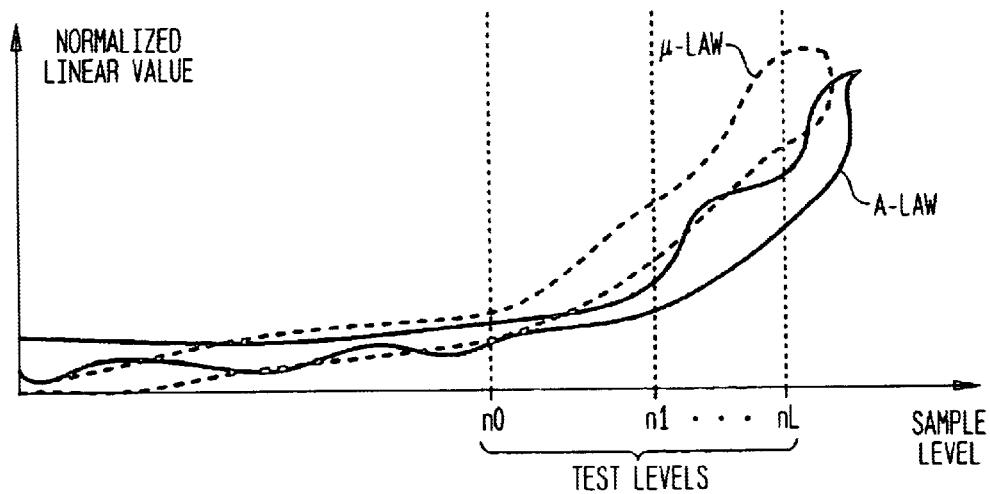
FIG. 4 shows a graph of normalized $\mu$-law and A-law vertex curves versus index value used to define a set of test level of a second exemplary implementation of the present invention.

For a second implementation, a set of PCM test levels is defined for detecting $\mu$-law or A-law line encoding when one or more additional line impairments, such as $\mu$-law/A-law conversion, line attenuation, and/or RBS, are present within the communication channel. FIG. 4 shows a graph of normalized $\mu$-law and A-law vertex curves versus index value when the transmission characteristics of a network are simulated and measured. The $\mu$-law and A-law vertex curves represent typical areas in which companding levels reconstructed at a destination modem may range when $\mu$-law/A-law conversion, line attenuation, and/or RBS is present within the communication channel between the source and destination modems.

The $\mu$-law and A-law vertex curves are determined by simulating the communication channel combinations if the destination modem detects the received signals as being either A-law encoded or $\mu$-law encoded. For example, for detecting A-law line encoding at the destination modem with an A-law vertex curve, simulations for A-law to A-law, A-law to $\mu$-law to A-law, $\mu$-law to A-law, and $\mu$-law to A-law to $\mu$-law to A-law networks may be measured. Similarly, for detecting $\mu$-law line encoding at the destination modem with a $\mu$-law vertex curve, simulations for A-law to $\mu$-law, A-law to $\mu$-law to A-law to $\mu$-law, $\mu$-law to $\mu$-law, and $\mu$-law to A-law to $\mu$-law networks may be measured. In addition, such simulations may account for RBS added to the communication channel, as well as different levels of line attenuation. The $\mu$-law and A-law vertex curves are plotted by plotting the maximum and minimum received values of the simulations for each transmitted index value (PCM test level).

Referring to FIG. 4, the set of PCM test levels n0 through nL may be determined from the graph of $\mu$-law and A-law vertex curves versus index value. Index value n0 may be an index value that generates a value common to both $\mu$-law and A-law vertex curves (i.e., the vertex curves overlap), and the remaining PCM test levels are selected as input sample values for which the areas of the $\mu$-law and A-law vertex curves do not overlap. A set of normalized threshold values s1 through sL are defined for a threshold vector St, St={s1, s2, . . . sL}. The set of threshold values may be the values between the $\mu$-law and A-law vertex curves for the set of PCM test levels n1 through nL, which values are then normalized. Selecting values between the $\mu$-law and A-law vertex curves may be, for example, $yai_{max} \leq Si \leq yui_{min}$, although other methods, such as the mean or median values between the vertex curves, may also be employed to select the threshold vector. Since PCM test level n0 is the input sample value that may generate a common value for both $\mu$-law and A-law curves, a receiver may employ the received signal value x0 corresponding to PCM test level n0 to normalize other received PCM test levels x1 through xL. The normalized values, denoted y1 through yL, may then be compared to corresponding normalized threshold values s1 through sL to detect whether $\mu$-law encoding or A-law encoding is used.

As in the first implementation, modems operating in accordance with the second implementation may exchange information about detected line encoding at corresponding ends of the communication channel to detect encoding conversion. However, for a situation with intermediate encoding conversion (e.g., A-law to $\mu$-law and back to A-law) simply exchanging information about detected line encoding at corresponding ends of the communication channel will not identify the presence of intermediate encoding conversion. In addition, a PCM test level K may be selected for one of the values n1–nL for detection of intermediate encoding conversion. The PCM test level K may have sufficient amplitude such that a destination modem, once the line-encoding is detected, may compare the corresponding normalized receive level to a decision metric (a decision threshold value) to detect encoding conversion. The decision metric may be based on a priori knowledge of the median value between the energy of the PCM test level K transmitted with the detected line encoding and the energy of the PCM test level K transmitted with encoding conversion to the detected line encoding. A confidence level for the decision metric may be determined based on the simulations of FIG. 4.

FIG. 5 shows an exemplary method of determining encoding and encoding conversion for the second implementation. First, at step 501 the source modem transmits the set of PCM test levels n0 through nL through the communication channel (e.g., over one or more telecommunication networks) to a destination modem. At step 502 the destination modem receives the transmitted set of PCM test levels as received levels x0 through xL. At step 503 the destination modem forms the set of normalized receive levels y1 through yL, where yi is xi/x0 and $1 \leq i \leq L$. The set of normalized receive levels y1 through yL forms a measure vector Ym, where Ym is {y1, y2, . . . , yL}.

At step 504, the distance between the measured vector Ym and threshold vector St is calculated. For the exemplary embodiment of FIG. 5, the distance is a measure of whether the measure vector Ym is closer to the $\mu$-law vertex curve or the A-law vertex curve based on the threshold vector St. Such distance may be calculated as a vector difference, though other distance calculations (e.g., sum of the squares) might also be employed. At step 505 a test determines which of the A-law and $\mu$-law vertex curves is closer in distance to the measured vector Ym. If the test of step 505 determines that the measured vector Ym is closer to the A-law vertex curve, then A-law encoding is detected; otherwise, the measured vector Ym is closer to the $\mu$-law vertex curve and $\mu$-law encoding is detected.

For a third implementation, for a case where the transmission characteristics are not accurately simulated and measured for all possible combinations to generate the graph shown in FIG. 4, a method of energy detection may be employed. The method of energy detection allows for approximate detection of $\mu$-law encoding or A-law encoding when one or more additional line impairments are present in the communication channel but a priori information of the network for accurate simulation is not available. As is illustrated in FIG. 4, the A-law and $\mu$-law vertex curves are separated (i.e., the vertex curves do not overlap) above a reference input sample. The separation of the vertex curves corresponds to greater energy under the $\mu$-law vertex curve than the energy under the A-law vertex curve for values greater than no, and the simulation information of FIG. 4 may be employed to design a method of detection using an estimate of the difference in energy.

As with the second implementation, index value n0 is an input signal level that may be generate an encoded value common to both $\mu$-law and A-law vertex curves. However, for the third implementation, the index value n0 is estimated based on curves similar to those of FIG. 4 generated with simulations of a much wider variety of network conditions because the transmission characteristics of the communication channel are generally not known. The remaining PCM test levels n1–nL are selected as index values for which the areas of the $\mu$-law and A-law vertex curves of FIG. 4 are estimated as being most unlikely to overlap for widely varying, added distortion. Since such estimated PCM test levels may be related to those input sample values corresponding to the greatest difference in total energy under the curve between the $\mu$-law and A-law vertex curves, an energy threshold Pt (i.e., a priori total signal energy) may be determined. Measured sample energy above the energy threshold Pt indicates that $\mu$-law line encoding is present, while measured sample energy below the energy threshold Pt indicates that A-law line encoding is present. Such energy threshold Pt may be related to a sum of the energy levels under the corresponding curves for each of the PCM test levels n1–nL.

FIG. 6 shows an exemplary method of determining $\mu$-law or A-law line encoding for the third implementation. First, at step 601, the source modem transmits the set of PCM test levels n0 through nL through the communication channel (e.g., over one or more telecommunication networks) to a destination modem. At step 602, the destination modem receives the transmitted set of PCM test levels as received levels x0 through xL. At step 603, the destination modem forms the set of normalized receive levels y1 through yL, where yi is xi/x0 and $1 \leq i \leq L$.

At step 604, the total power Pt is calculated as sum of the squares of the set of normalized receive levels y1 through yL, (i.e., Pt is sum of the powers of the test levels and is $\{y1^2+y2^2+ \ldots +yL^2\}$. At step 605, a test determines which of the A-law and $\mu$-law vertex curves is above or below the energy threshold Pt. If the test of step 605 determines that Pav is greater than the energy threshold Pt, then $\mu$-law line encoding is detected, but if the test of step 605 determines that Pav is less than the energy threshold Pt, then A-law line encoding is detected.

Modems operating in accordance with certain implementations of the present invention may separately detect signal attenuation/distortion caused by line impedance of, for example, analog lines 106 and 107 of FIG. 1. Signal attenuation/distortion may also result from analog-to-digital (AID) conversion of the modem's analog signal (e.g., distortion added by, e.g., by codec 103) and digital-to analog (D/A) conversion to reconstruct the analog signal (e.g., sampling distortion added by, e.g., codec 105). For example, a ratio of the known transmitted PCM test level n0 of the transmit modem (i.e., the a priori signal level) with the received signal level (at the receive modem) may be computed to obtain a value having minimal encoding and encoding conversion distortion. The PCM test level is selected so that the quantizing levels between the different encoding types (companding functions) are either the same or add no distortion when mapped between the different encoding types. The average of the ratios over several consecutive T1 frames may then be used as a measure of the signal loss (Aloss), several consecutive T1 frames being measured to reduce effects of superimposed information channels. A pair of source and destination modems may then adjust transmission characteristics to compensate for the detected line impairments. Such techniques for line impairment detection and compensation are described in, for example, U.S. patent application Ser. No. 09/296,516, filed Apr. 22, 1999 now U.S. Pat. No. 6,523,233, the teachings of which are also incorporated herein by reference.

A modem operating in accordance with one or more implementations of the present invention may also separately detect the presence or absence of a separate, superimposed information channel, such as an RBS channel. A pair of source and destination modems may adjust transmitted and received signal levels (e.g., the modem's transmit constellation) to account for the presence of the detected information channel. While the following describes detection of RBS, one skilled in the art may readily extend the teachings herein to other types of superimposed, information channels.

For separate detection of RBS, the set of PCM test levels, such as those selected to determine line encoding and/or encoding conversion of the first, second, and third implementations is passed through the communication channel from the source modem to the destination modem. PCM test levels may be generally degraded by RBS signaling bits if RBS signaling is present in the channel. For RBS detection, the destination modem reconstructs the encoding sample values (i.e., A-law or $\mu$-law levels) from the received signal. The encoding sample values correspond to the PCM line $\mu$-law or A-law encoded PCM test levels transmitted through the communication channel. For each PCM test level, the encoding sample values of a received PCM test level are examined to detect modified values that may correspond to RBS bits set within particular frames. For example, the source modem may transmit the set of PCM test levels with a period substantially equivalent to the period of the RBS frames in a T1 frame. For some RBS systems, every sixth frame may contain RBS information. For a T1 superframe line format, the period of the RBS information channel corresponds to 24 frames of information (i.e., 24 consecutive samples). Detection of RBS by the destination modem is based on examining the distortion of reconstructed encoding sample values in several consecutive sequences of the T1(e.g., to detect distortion of reconstructed encoding sample values corresponding to every sixth T1 frame).

A T1 frame includes a single encoded sample for each channel. However, a PCM test level is an analog signal that is sampled (such as either a DC or a sinusoidal carrier having fixed amplitude), and so is represented by a sequence of encoded samples. Consequently, it requires a sequence of T1 frames to transmit the encoded samples representing one PCM test level. For the following description, a modem transmits a PCM test level over a sequence of frames, and several sequences of frames are required to transmit the set of PCM test levels. In addition, since an RBS channel uses twelve or twenty-four T1 frames as a period of the information channel, the sequence of frames for a PCM test level preferably spans several periods of the RBS channel.

Figure 7:
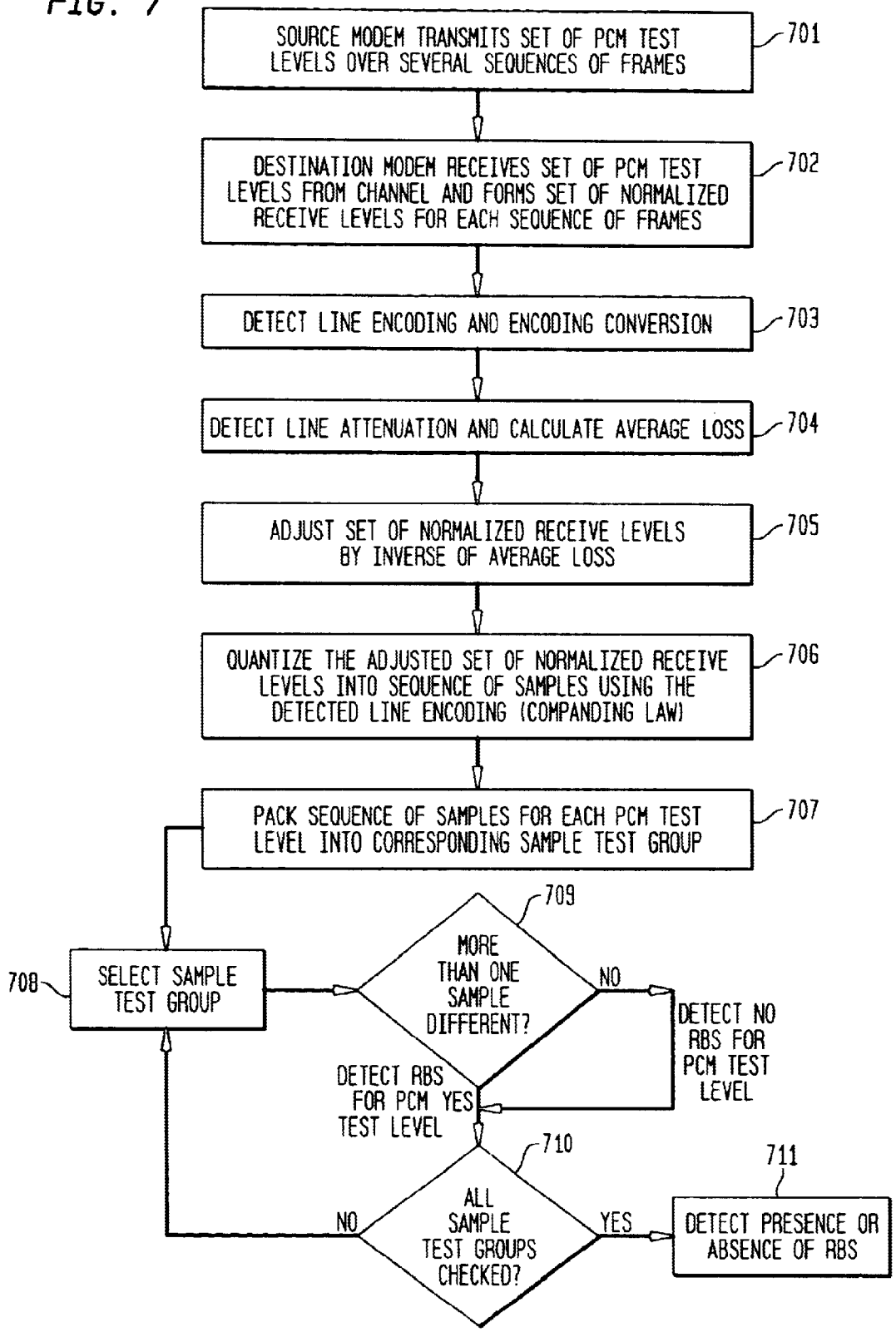
FIG. 7 shows a flowchart of a method of detecting a superimposed information channel as may be employed with exemplary embodiments of the present invention.

FIG. 7 shows a flowchart for a method of detection of RBS as may be employed with the present invention. At step 701, the source modem transmits a set of PCM test levels n0–nL generated such as described previously with respect to FIGS. 2–6, each PCM test level is transmitted with a duration that ensures encoded samples are generated over several sequences of frames. Such duration is related to the period of the RBS information channel. Each PCM test level repeats with a period corresponding to the period of the RBS information channel (i.e., the period of the frames including an RBS information channel). At step 702, the destination modem receives the set of signals x0–xL corresponding to the set of PCM test levels n0–nL for each sequence of frames, and forms the set of normalized receive levels y1 through yL, where yi is xi/x0 and $1 \leq i \leq L$. At step 703, the destination modem detects line encoding (e.g., A-law or $\mu$-law line encoding) and/or encoding conversion (e.g., A-law to law conversion) as described previously for the first, second, and third implementations. At step 704, the destination modem detects line attenuation from the received test levels as described previously and calculates the average loss ALoss, and the inverse of ALoss (AGain, i.e., AGain=(1/ALoss)).

At step 705, normalized receive test levels y1 through yL are 1) adjusted by AGain to compensate for the line attenuation, if present (i.e., $y1_{adj}$ is y1*AGain, $y2_{adj}$ is y2*AGain, . . . , $yL_{adj}$ is yL*AGain) and 2) may also be adjusted for the encoding conversion to compensate for quantization noise. At step 706, the normalized receive test levels adjusted in step 705 are then quantized (i.e., digitally sampled in accordance with the companding law definition of the detected codec) into encoding sample values in accordance with the detected encoding or encoding conversion of step 703. For example, a slicer table may be employed with entries corresponding to $\mu$-law quantizing levels (encoding sample values), if $\mu$-law encoding is detected in step 703. When using a slicer table, the value of $y1_{adj}$, for example, is compared to each slicer table entry and assigned the value of the slicer table that is closest to $y1_{adj}$. Entries of the slicer table may be further modified to account for encoding conversion to $\mu$-law quantizing levels, with such entries used if encoding conversion is detected between the source and destination modems.

At step 707, the sequence of samples for each of the quantized, adjusted levels of step 706 is packed into a sample test group. The sequence of samples in each sample test group correspond to encoded samples of the same PCM test level, and may be samples of several, separately received signals over several T1 frames that each correspond to the same PCM test level. Consequently, one sample test group for each of the set of PCM test levels may be formed. At step 708, one of the sample test groups is selected.

At step 709, a test determines whether all samples of the test group selected in step 708 correspond to the same encoded sample value. If all samples are the same value, then no decision for RBS presence or absence is made for that test group. Otherwise, if one or more samples are different, then a tentative decision that RBS is present is made for the test group. At step 710, a test determines if all sample test groups were examined. If the test of 710 determines that other sample test groups remain to be examined, the method returns to step 709 and another sample test group is selected. If the test of 710 determines that all sample test groups are examined, at step 711 a decision is made as to whether RBS (or other information channel) is detected. The decision may be based on how many of the sample test groups have associated tentative decisions that RBS is present, or other statistical methods may be employed to make the decision. For example, since RBS changes the least significant bits of a sample, one may specify which samples for each of the quantized, adjusted levels may be effected. Confidence in RBS detection may be improved if a majority of the tentative decisions correspond to the specified samples. In addition, if all samples are the same for each sample test group, or different samples in sample test groups appear randomly between sample test groups, then the decision should be that the superimposed RBS information channel is absent.

Modems operating in accordance with certain implementations of the present invention may employ a method of constellation adjustment to correct for distortion resulting from network transmission characteristics, such as line encoding, encoding conversion, RBS, or line attenuation. As is known in the art, a modem constellation comprises analog carrier signals representing binary symbols, such as binary or quadrature phase-shift keyed symbols. The constellation may be generated by a modem by reading a sequence of digital values from a look-up table corresponding to amplitude levels of the analog constellation for a symbol. For a given, detected encoding conversion during the training phase, two constellations are employed, one for the source modem and one for the destination modem. For constellation adjustment, each modem first detects encoding, encoding conversion, RBS, and other line impairments using a set of PCM test levels during their respective training phases, such as described previously. The destination modem then adjusts the digital values stored in the look-up table used to generate its transmit constellation. The transmit constellation is employed for communication (data transmission) with the source modem based on the detected line encoding, encoding conversion, RBS, and/or other line impairments. The transceivers may also exchange information as to their respective detected line encoding, encoding conversion, RBS, and other line impairments.

Figure 8:
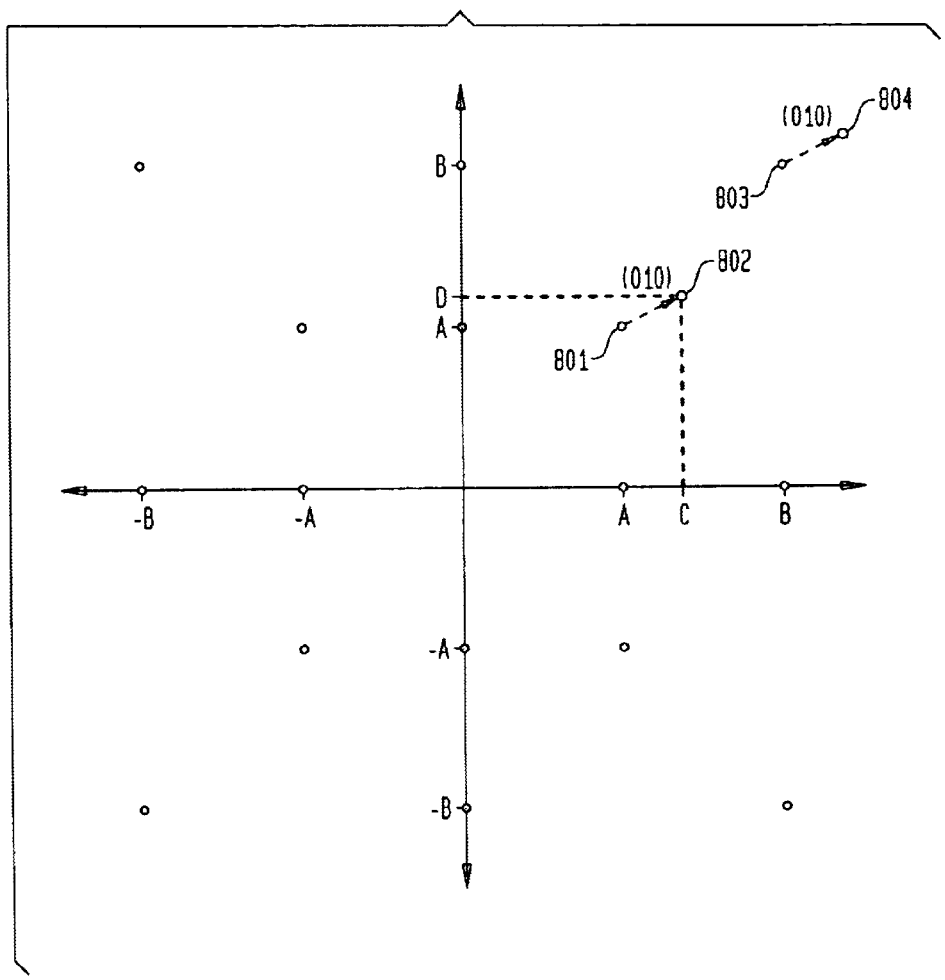
FIG. 8 shows a modem transmit constellation before and after adjustment in accordance with an exemplary implementation of the present invention.

FIG. 8 shows a modem transmit constellation that may be adjusted in accordance with an exemplary implementation of the present invention. The constellation of FIG. 8 comprises 16 points, with each point corresponding to one of 16 binary data values transmitted by the modem. Each of the black circles represents a symbol that may be formed by in-phase (e.g. $\cos \overline{\omega t}$) carrier signal and a quadrature-phase (e.g. $\sin \overline{\omega t}$) carrier signal with a corresponding amplitude (e.g., $\pm A$ and $\pm B$). For example, constellation point 801 may be formed as $A \cos(\overline{\omega t}) + A \sin(\overline{\omega t})$. As is known in the art, constellation points map to symbols, which for point 801 is the binary symbol (010). When transmitted through a channel, distortion added to the signal $A \cos(\overline{\omega t}) + A \sin(\overline{\omega t})$ yields the signal $C \cos(\overline{\omega t}) + D \sin(\overline{\omega t})$ (i.e., the magnitude A is increased to magnitude C in the in-phase component and the magnitude A is increased to magnitude D in the quadrature-phase component). Distortion added to the signal $A \cos(\overline{\omega t}) + A \sin(\overline{\omega t})$ results in point 801 moving to a new point, shown as circle 802. All points of the constellation may be affected, such as point 803 (representing symbol 011) moving to point 804.

A modem may form the constellation shown in FIG. 8 as follows. The modem includes a table of, for example, 64 binary values corresponding to 16 equally spaced signal points of the carrier signal $\cos(\overline{\omega t})$. By sequentially reading table values from the table to a digital-to-analog converter (D/A) during a predefined interval, the output signal of the D/A corresponds to the signal $\cos(\overline{\omega t})$. By starting to read table values by an offset of addresses within the table, the carrier signal $\sin(\overline{\omega t})$ may be formed (e.g, starting with the 5th table value). To form a constellation point, the first table value for $\cos(\overline{\omega t})$ is retrieved and multiplied by a constant (such as a constant A for point 801), and the offset address table value for $\sin(\overline{\omega t})$ is retrieved and multiplied by a constant (such as a constant A for point 801). The results are combined to form a binary representation of a signal level of the resulting constellation point signal $A \cos(\overline{\omega t}) + A \sin(\overline{\omega t})$. Subsequent signal levels of the resulting constellation point signal are similarly formed as the modem sequentially reads out table values for in-phase and quadrature phase signal components during the predefined interval. Alternatively, a single, larger table may be formed with each entry of the table being a binary representation of a signal level of a constellation point. The resulting sequence of values (i.e., a sequence of signal levels) is provided to the D/A to generate the analog output signal of the modem.

When a modem has a priori knowledge that, for example, constellation point 801 may be moved to point 802 by distortion, the modem may correct for the distortion by adjusting the modem constellation signal. For example, subtracting (C−A) from the constant A of the in-phase component and subtracting (D−A) from the constant A of the quadrature component compensates for the distortion that moves point 801 to point 802. As Consequently, a modem may form a table of values that are used to adjust the constants (e.g., constants A and B) of the in-phase and quadrature phase components.

Figure 9:
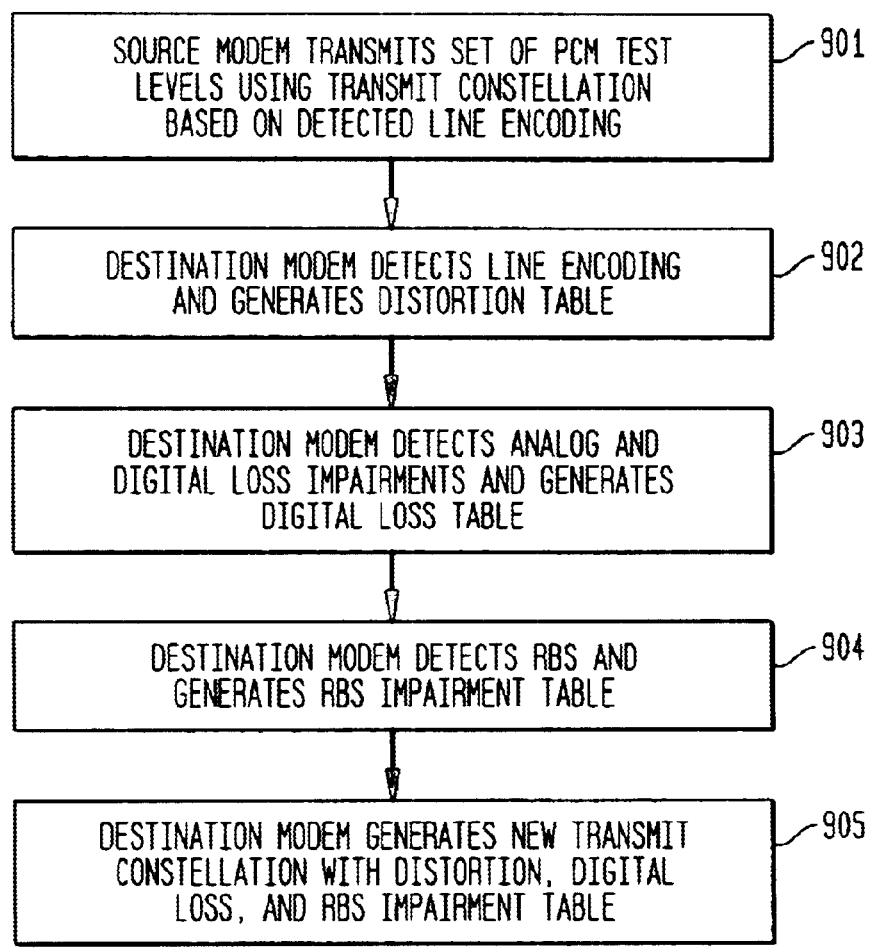
FIG. 9 shows a flow chart of modem constellation adjustment for encoding conversion, line impairments, and superimposed information channels detected in accordance with the methods of FIGS. 5, 6, and 7.

FIG. 9 shows a flow chart of modem constellation adjustment for encoding conversion, line impairments, and superimposed information channels detected in accordance with the methods of FIGS. 3, 5, 6, and 7. At step 901, the source modem transmits the set of PCM test levels using the source modem constellation. The source modem constellation is based on the line encoding detected by the source modem either by a priori provisioning or from a set of PCM test levels it receives from another modem. At step 902, the destination modem detects line encoding based on the transmitted set of PCM test levels from the source modem and generates a distortion table for the detected conversion between the source and destination modems (e.g., a table of reversed, encoding conversion values). At step 903, the destination modem detects analog and digital loss impairments based on the transmitted set of PCM test levels, and the destination modem generates a digital loss table (e.g., a table of inverse loss values). At step 904, the destination modem detects RBS, and/or other superimposed information channels based on the transmitted set of PCM test levels, and generates an RBS impairment table. At step 905, the destination modem designs a transmit constellation using the distortion, digital loss, and RBS impairment tables to adjust the constellation levels designed for the detected line encoding of the destination modem transmitting to the source modem.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. For a signal processing application, a method of detecting line encoding in accordance with one of a plurality of encoding algorithms in a signal transmitted through a telecommunication channel, the method comprising the steps of:

(a) generating the signal comprising a set of test levels, wherein each of the test levels is selected based on the relative difference between each of the plurality of encoding algorithms when encoding a test level, and all of the encoding algorithms encode one of the test levels to generate a substantially equivalent value; and (b) comparing a combination of the test levels transmitted through the communication channel to a decision metric, wherein the decision metric is based on a measure of the difference between one or more of the set of test levels prior to being transmitted through the communication channel to each corresponding one or more of the set of test levels after the signal is transmitted through the communication channel, and wherein the one test level encoded by all of the encoding algorithms to generate a substantially equivalent value is employed to normalize the corresponding remaining test levels for the signal i) prior to and ii) after the signal transmission through the communication channel; and (c) detecting the line encoding according to one of the encoding algorithms based on the comparison of the combination with the decision metric.

2. The invention as recited in claim 1, further comprising the step of (d) compensating the signal for a distortion of the signal based on the detected line encoding.

3. The invention as recited in claim 2, wherein step (c) further comprises the steps of i) detecting the presence or absence of encoding conversion between two or more of the plurality of encoding algorithms in the communication channel, and step (d) further comprises the step of compensating the signal for a distortion of the signal based on the detected presence of encoding conversion.

4. The invention as recited in claim 2, wherein step (c) further comprises the step of detecting transmission characteristics of the communication channel comprising superimposed information channels, digital conversion impairments, and analog line impairments, and wherein step (d) further comprises the step of compensating the signal for a distortion of the signal based on detected transmission characteristics.

5. The invention as recited in claim 2, wherein step (d) compensates the signal for a distortion of the signal based on the detected line encoding by adjusting either i) samples of received signals based on a look-up table, or ii) a constellation of a modem transmitting data as modulated signals rough the communication channel.

6. The invention as recited in claim 1, wherein the decision metric of step (b) employs a threshold vector determined by the steps of:

(b1) generating an ideal test level vector for each of the plurality of encoding algorithms, the ideal test level vector defined by encoding, with the corresponding one plurality of encoding algorithms, each of the set of test levels prior to transmission through the communication channel, wherein the set of test levels are selected such that encoding with each of the plurality of encoding algorithms generates a different encoded value;

(b2) determining the threshold vector as a set of threshold values corresponding to each of the set of test levels, each threshold value representing a value between the ideal test level vectors generated in step (b1).

7. The invention as recited in claim 6, further comprising the step of generating a received test level vector from the set of test levels after the signal is transmitted through the communication channel; and wherein the decision metric of step (b) is either i) an error measure representing a distance between the received test level vector and the ideal test level vector for each of the plurality of encoding algorithms; or ii) a power error measure representing a difference between the energy of the received test level vector and the energy of the ideal test level vector for each of the plurality of encoding algorithms.

8. The invention as recited in claim 6, wherein one ideal test level vector is generated by encoding each of the set of test levels with a pulse code modulation (PCM) with A-law companding algorithm, and another ideal test level vector is generated by encoding each of the set of test levels with a PCM with $\mu$-law companding algorithm.

9. The invention as recited in claim 8, wherein each amplitude of the set of test levels is varied in accordance with simulated transmission characteristics of the communication channel such that the ideal test level vector generated by encoding each varying one of the set of test levels with the pulse code modulation (PCM) with A-law companding algorithm and with the PCM with $\mu$-law companding algorithm defines corresponding vertex curve.

10. The invention as recited in claim 9, wherein the simulated transmission characteristics comprise superimposed information channels, digital conversion impairments, and analog line impairments.

11. The invention as recited in claim 1, wherein step (c) further comprises the step of detecting encoding conversion between two or more of the plurality of encoding algorithms in the communication channel and one or more of i) line encoding with an encoding algorithm, ii) robbed-bit signaling, iii) digital conversion impairments, and iv) analog line impairments.

12. The invention as recited in claim 1, wherein, for step (c), the plurality of encoding algorithms are a pulse code modulation (PCM) with A-law companding and a PCM with $\mu$-law companding.

13. The invention as recited in claim 12, wherein step (c) further includes the step of detecting, based on the set of test levels received from the communication channel, the line encoding in accordance with the PCM with A-law companding algorithm and the PCM with $\mu$-law companding algorithm.

14. The invention as recited in claim 1, wherein the method is implemented by a processor in an integrated circuit.

15. For a signal processing application, a circuit for detecting line encoding in accordance with one of a plurality of encoding algorithms in a signal transmitted through a telecommunication channel from a modem, comprising:

a comparator comparing i) a combination of a set of test levels in the signal transmitted through the communication channel to ii) a decision metric, wherein each of the test levels is selected based on the relative difference between each of the plurality of encoding algorithms when encoding a test level, and all of the encoding algorithms encode one of the test levels to generate a substantially equivalent value, and wherein the decision metric is based on a measure of the difference between one or more of the set of test levels prior to being transmitted through the communication channel to each corresponding one or more of the set of test levels after the signal is transmitted through the communication channel, and wherein the one test level encoded by all of the encoding algorithms to generate a substantially equivalent value is employed to normalize the corresponding remaining test levels for the signal i) prior to and ii) after the signal transmission through the communication channel; and a detector detecting the line encoding according to one of the encoding algorithms based on the comparison of the combination with the decision metric.

16. The invention as recited in claim 15, wherein the circuit compensates the signal for a distortion of the signal based on the detected line encoding.

17. The invention as recited in claim 16, wherein the detector detects the presence or absence of encoding conversion between two or more of the plurality of encoding algorithms in the communication channel, and the circuit compensates the signal for a distortion of the signal based on the detected presence of encoding conversion.

18. The invention as recited in claim 16, wherein the detector detects transmission characteristics of the communication channel comprising superimposed information channels, digital conversion impairments, and analog line impairments, and the circuit compensates the signal based on detected transmission characteristics.

19. The invention as recited in claim 15, further comprising a modulator for generating a modem constellation, and wherein the circuit compensates the signal by adjusting either i) samples of received signals based on a look-up table, or ii) a constellation of the modulator transmitting data as modulated signals through the communication channel.

20. The invention as recited in claim 15, wherein the decision metric employs a threshold vector determined by:

(1) generating an ideal test level vector for each of the plurality of encoding algorithms, the ideal test level vector defined by encoding, with the corresponding one plurality of encoding algorithms, each of the set of test levels prior to transmission through the communication channel, wherein the set of test levels are selected such that encoding with each of the plurality of encoding algorithms generates a different encoded value;

(2) determining the threshold vector as a set of threshold values corresponding to each of the set of test levels, each threshold value representing a value between the ideal test level vectors.

21. The invention as recited in claim 20, wherein the circuit generates a received test level vector from the set of test levels after the signal is transmitted through the communication channel; and wherein the decision metric is either i) an error measure representing a distance between the received test level vector and the ideal test level vector for each of the plurality of encoding algorithms; or ii) a power error measure representing a difference between the energy of the received test level vector and the energy of the ideal test level vector for each of the plurality of encoding algorithms.

22. The invention as recited in claim 20, wherein one ideal test level vector is generated by encoding each of the set of test levels with a pulse code modulation (PCM) with A-law companding algorithm, and another ideal test level vector is generated by encoding each of the set of test levels with a PCM with $\mu$-law companding algorithm.

23. The invention as recited in claim 22, wherein each amplitude of the set of test levels is varied in accordance with simulated transmission characteristics of the communication channel such that the ideal test level vector generated by encoding each varying one of the set of test levels with the pulse code modulation (PCM) with A-law companding algorithm and with the PCM with $\mu$-law companding algorithm defines corresponding vertex curve.

24. The invention as recited in claim 23, wherein the simulated transmission characteristics comprise superimposed information channels, digital conversion impairments, and analog line impairments.

25. The invention as recited in claim 15, wherein the detector detects encoding conversion between two or more of the plurality of encoding algorithms in the communication channel and one or more of i) line encoding with an encoding algorithm, ii) robbed-bit signaling, iii) digital conversion impairments, and iv) analog line impairments.

26. The invention as recited in claim 15, wherein the plurality of encoding algorithms are a pulse code modulation (PCM) with A-law companding and a PCM with $\mu$-law companding.

27. The invention as recited in claim 15, wherein the circuit is embodied in an integrated circuit.

28. A computer-readable medium having stored thereon a plurality of instructions, the plurality of instructions including instructions which, when executed by a processor, cause the processor to implement a method of detecting line encoding in accordance with one of a plurality of encoding algorithms in a signal transmitted through a telecommunication channel, the method comprising the steps of:

(a) generating the signal comprising a set of test levels, wherein each of the test levels is selected based on the relative difference between each of the plurality of encoding algorithms when encoding a test level, and all of the encoding algorithms encode one of the test levels to generate a substantially equivalent value; and (b) comparing a combination of the test levels transmitted through the communication channel to a decision metric, wherein the decision metric is based on a measure of the difference between one or more of the set of test levels prior to being transmitted through the communication channel to each corresponding one or more of the set of test levels after the signal is transmitted through the communication channel, and wherein the one test level encoded by all of the encoding algorithms to generate a substantially equivalent value is employed to normalize the corresponding remaining test levels for the signal i) prior to and ii) after the signal transmission through the communication channel; and (c) detecting the line encoding according to one of the encoding algorithms based on the comparison of the combination with the decision metric.

29. The invention as recited in claim 28, further comprising the step of (d) compensating the signal for a distortion of the signal based on the detected line encoding.

30. The invention as recited in claim 29, wherein step (c) further comprises the steps of i) detecting the presence or absence of encoding conversion between two or more of the plurality of encoding algorithms in the communication channel, and step (d) further comprises the step of compensating the signal for a distortion of the signal based on the detected presence of encoding conversion.

31. The invention as recited in claim 29, wherein step (c) further comprises the step of detecting transmission characteristics of the communication channel comprising superimposed information channels, digital conversion impairments, and analog line impairments, and wherein step (d) further comprises the step of compensating the signal for a distortion of the signal based on detected transmission characteristics.

32. The invention as recited in claim 29, wherein step (d) compensates the signal for a distortion of the signal based on the detected line encoding by adjusting either i) samples of received signals based on a look-up table, or ii) a constellation of a modem transmitting data as modulated signals through the communication channel.

33. The invention as recited in claim 28, wherein the decision metric of step (b) employs a threshold vector determined by the steps of:
(b1) generating an ideal test level vector for each of the plurality of encoding algorithms the ideal test level vector defined by encoding, with the corresponding one plurality of encoding algorithms, each of the set of test levels prior to transmission through the communication channel, wherein the set of test levels arm selected such that encoding with each of the plurality of encoding algorithms generates a different encoded value;
(b2) determining the threshold vector as a set of threshold values corresponding to each of the set of test levels, each threshold value representing a value between the ideal test level vectors generated in step (b1).

34. The invention as recited in claim 33, further comprising the step of generating a received test level vector from the set of test levels after the signal is transmitted through the communication channel; and
wherein the decision metric of step (b) is either i) an error measure representing a distance between the received test level vector and the ideal test level vector for each of the plurality of encoding algorithms; or ii) a power error measure representing a difference between the energy of the received test level vector and the energy of the ideal test level vector for each of the plurality of encoding algorithms.

35. The invention as recited in claim 33, wherein one ideal test level vector is generated by encoding each of the set of test levels with a pulse code modulation (PCM) with A-law companding algorithm, and another ideal test level vector is generated by encoding each of the set of test levels with a PCM with $\mu$-law companding algorithm.

36. The invention as recited in claim 35, wherein each amplitude of the set of test levels is varied in accordance with simulated transmission characteristics of the communication channel such that the ideal test level vector generated by encoding each varying one of the set of test levels with the pulse code modulation (PCM) with A-law companding algorithm in and with the PCM with $\mu$-law companding algorithm defines corresponding vertex curve.

37. For a signal processing application, a method of detecting line encoding in accordance with one of a plurality of encoding algorithms in a signal transmitted through a telecommunication channel, the method comprising the steps of:
(a) generating the signal comprising a set of test levels, wherein each of the test levels is selected based on the relative difference between each of the plurality of encoding algorithms when encoding a test level, and all of the encoding algorithms encode one of the test levels to generate a substantially equivalent value; and
(b) comparing a combination of the test levels transmitted through the communication channel to a decision metric,
(c) detecting the line encoding according to one of the encoding algorithms based on the comparison of the combination with the decision metric,
wherein the decision metric is based on a measure of the difference between one or more of the set of test levels prior to being transmitted through the communication channel to each corresponding one or more of the set of test levels after the signal is transmitted through the communication channel, the one test level of the set of test levels that is encoded by all of the encoding algorithms to generate a substantially equivalent value employed to normalize the remaining test levels for the comparison; and wherein the decision metric of step (b) employs a threshold vector determined by the steps of:
(b1) generating an ideal test level vector for each of the plurality of encoding algorithms, the ideal test level vector defined by encoding, with the corresponding one plurality of encoding algorithms, each of the set of test levels prior to transmission through the communication channel, wherein the set of test levels are selected such that encoding with each of the plurality of encoding algorithms generates a different encoded value;
(b2) determining the threshold vector as a set of threshold values corresponding to each of the set of test levels, each threshold value representing a value between the ideal test level vectors generated in step (b1), and
wherein the decision metric of step (b) is either i) an error measure representing a distance between the received test level vector and the ideal test level vector for each of the plurality of encoding algorithms; or ii) a power error measure representing a difference between the energy of the received test level vector and the energy of the ideal test level vector for each of the plurality of encoding algorithms; and
(d) generating a received test level vector from the set of test levels after the signal is transmitted through the communication channel.

38. For a signal processing application, a method of detecting line encoding in accordance with one of a plurality of encoding algorithms in a signal transmitted through a telecommunication channel, the method comprising the steps of:
(a) generating the signal comprising a set of test levels, wherein each of the test levels is selected based on the relative difference between each of the plurality of encoding algorithms when encoding a test level, and all of the encoding algorithms encode one of the test levels to generate a substantially equivalent value; and
(b) comparing a combination of transmitted through the communication channel to a decision metric,
(c) detecting the line encoding according to one of the encoding algorithms based on the comparison of the combination with the decision metric,
wherein the decision metric is based on a measure of the difference between one or more of the set of test levels prior to being transmitted through the communication channel to each corresponding one or more of the set of test levels after the signal is transmitted through the communication channel, the one test level of the set of test levels that is encoded by all of the encoding algorithms to generate a substantially equivalent value employed to normalize the remaining test levels for the comparison; and wherein the decision metric of step (b) employs a threshold vector determined by the steps of:
(b1) generating an ideal test level vector for each of the plurality of encoding algorithms, the ideal test level vector defined by encoding, with the corresponding one plurality of encoding algorithms, each of the set of test levels prior to transmission through the communication channel, wherein the set of test levels are selected such that encoding with each of the plurality of encoding algorithms generates a different encoded value;

(b2) determining the threshold vector as a set of threshold values corresponding to each of the set of test levels, each threshold value representing a value between the ideal test level vectors generated in step (b1), and wherein one ideal test level vector is generated by encoding each of the set of test levels with a pulse code modulation (PCM) with A-law companding algorithm, and another ideal test level vector is generated by encoding each of the set of test levels with a PCM with $\mu$-law companding algorithm, and wherein each amplitude of the set of test levels is varied in accordance with simulated transmission characteristics of the communication channel such that the ideal test level vector generated by encoding each varying one of the set of test levels with the pulse code modulation (PCM) with A-law companding algorithm and with the PCM with $\mu$-law companding algorithm defines a corresponding vertex curve.

39. The invention as recited in claim 38, wherein the simulated transmission characteristics comprise superimposed information channels, digital conversion impairments, and analog line impairments.

40. For a signal processing application, a circuit for detecting line encoding in accordance with one of a plurality of encoding algorithms in a signal transmitted through a telecommunication channel from a modem, comprising:

a comparator comparing i) a combination of a set of test levels in the signal transmitted through the communication channel to ii) a decision metric, wherein each of the test levels is selected based on the relative difference between each of the plurality of encoding algorithms when encoding a test level, and all of the encoding algorithms encode one of the test levels to generate a substantially equivalent value, and wherein the decision metric is based on a measure of the difference between one or more of the set of test levels prior to being transmitted through the communication channel to each corresponding one or more of the set of test levels after the signal is transmitted through the communication channel, the one test level of the set of test levels that is encoded by all of the encoding algorithms to generate a substantially equivalent value employed to normalize the remaining test levels for the comparison; and a detector detecting the line encoding according to one of the encoding algorithms based on the comparison of the combination with the decision metric, wherein the decision metric is either i) an error measure representing a distance between the received test level vector and the ideal test level vector for each of the plurality of encoding algorithms; or ii) a power error measure representing a difference between the energy of the received test level vector and the energy of the ideal test level vector for each of the plurality of encoding algorithms, and wherein the decision metric employs a threshold vector determined by:

(1) generating an ideal test level vector for each of the plurality of encoding algorithms, the ideal test level vector defined by encoding, with the corresponding one plurality of encoding algorithms, each of the set of test levels prior to transmission through the communication channel, wherein the set of test levels are selected such that encoding with each of the plurality of encoding algorithms generates a different encoded value;

(2) determining the threshold vector as a set of threshold values corresponding to each of the set of test levels, each threshold value representing a value between the ideal test level vectors, and wherein the circuit generates a received test level vector from the set of test levels after the signal is transmitted through the communication channel.

41. For a signal processing application, a circuit for detecting line encoding in accordance with one of a plurality of encoding algorithms in a signal transmitted trough a telecommunication channel from a modem, comprising:

a comparator comparing i) a combination of a set of test levels in the signal transmitted through the communication channel to ii) a decision metric, wherein each of the test levels is selected based on the relative difference between each of the plurality of encoding algorithms when encoding a test level and all of the encoding algorithms encode one of the test levels to generate a substantially equivalent value, and wherein the decision metric is based on a measure of the difference between one or more of the set of test levels prior to being transmitted through the communication channel to each corresponding one or more of the set of test levels after the signal is transmitted through the communication channel, the one test level of the set of test levels that is encoded by all of the encoding algorithms to generate a substantially equivalent value employed to normalize the remaining test levels for the comparison; and a detector detecting the line encoding according to one of the encoding algorithms based on the comparison of the combination with the decision metric, wherein the decision metric employs a threshold vector determined by:

(1) generating an ideal test level vector for each of the plurality of encoding algorithms, the ideal test level vector defined by encoding, with the corresponding one plurality of encoding algorithms, each of the set of test levels prior to transmission through the communication channel, wherein the set of test levels are selected such that encoding with each of the plurality of encoding algorithms generates a different encoded value; and (2) determining the threshold vector as a set of threshold values corresponding to each of the set of test levels, each threshold value representing a value between the ideal test level vectors, wherein one ideal test level vector is generated by encoding each of the set of test levels with a pulse code modulation (PCM) with A-law companding algorithm, and another ideal test level vector is generated by encoding each of the set of test levels with a PCM with $\mu$-law companding algorithm, and wherein each amplitude of the set of test levels is varied in accordance with simulated transmission characteristics of the communication channel such that the ideal test level vector generated by encoding each varying one of the set of test levels with the pulse code modulation (PCM) with A-law companding algorithm and with the PCM with $\mu$-law companding algorithm defines corresponding vertex curve.

42. The invention as recited in claim 41, wherein the simulated transmission characteristics comprise superimposed information channels, digital conversion impairments, and analog line impairments.

43. A computer-readable medium having stored thereon a plurality of instructions, the plurality of instructions including instructions which, when executed by a processor, cause the processor to implement a method of detecting line encoding in accordance with one of a plurality of encoding algorithms in a signal transmitted through a telecommunication channel the method comprising the steps of:

(a) generating the signal comprising a set of test levels, wherein each of the test levels is selected based on the relative difference between each of the plurality of encoding algorithms when encoding a test level, and all of the encoding algorithms encode one of the test levels to generate a substantially equivalent value; and (b) comparing a combination of the test levels transmitted through the communication channel to a decision metric, (c) detecting the line encoding according to one of the encoding algorithms based on the comparison of the combination with the decision metric, wherein the decision metric is based on a measure of the difference between one or more of the set of test levels prior to being transmitted through the communication channel to each corresponding one or more of the set of test levels after the signal is transmitted through the communication channel, the one test level of the set of test levels that is encoded by all of the encoding algorithms to generate a substantially equivalent value employed to normalize the remaining test levels for the comparison; and wherein the decision metric of step (b) employs a threshold vector determined by the steps of:

(b1) generating an ideal test level vector for each of the plurality of encoding algorithms, the ideal test level vector defined by encoding, with the corresponding one plurality of encoding algorithms, each of the set of test levels prior to transmission through the communication channel, wherein the set of test levels are selected such that encoding with each of the plurality of encoding algorithms generates a different encoded value;

(b2) determining the threshold vector as a set of threshold values corresponding to each of the set of test levels, each threshold value representing a value between the ideal test level vectors generated in step (b1), and wherein the decision metric of step (b) is either i) an error measure representing a distance between the received test level vector and the ideal test level vector for each of the plurality of encoding algorithms; or ii) a power error measure representing a difference between the energy of the received test level vector and the energy of the ideal test level vector for each of the plurality of encoding algorithms; and (d) generating a received test level vector from the set of test levels after the signal is transmitted through the communication channel.

44. A computer-readable medium having stored thereon a plurality of instructions, the plurality of instructions including instructions which, when executed by a processor, cause the processor to implement a method of detecting line encoding in accordance with one of a plurality of encoding algorithms in a signal transmitted through a telecommunication channel, the method comprising the steps of:

(a) generating the signal comprising a set of test levels, wherein each of the test levels is selected based on the relative difference between each of the plurality of encoding algorithms when encoding a test level, and all of the encoding algorithms encode one of the test levels to generate a substantially equivalent value; and (b) comparing a combination of the test levels transmitted through the communication channel to a decision metric, (c) detecting the line encoding according to one of the encoding algorithms based on the comparison of the combination with the decision metric, wherein the decision metric is based on a measure of the difference between one or more of the set of test levels prior to being transmitted through the communication channel to each corresponding one or more of the set of test levels after the signal is transmitted through the communication channel, the one test level of the set of test levels that is encoded by all of the encoding algorithms to generate a substantially equivalent value employed to normalize the remaining test levels for the comparison; and wherein the decision metric of step (b) employs a threshold vector determined by the steps of:

(b1) generating an ideal test level vector for each of the plurality of encoding algorithms, the ideal test level vector defined by encoding, with the corresponding one plurality of encoding algorithms, each of the set of test levels prior to transmission through the communication channel wherein the set of test levels arc selected such that encoding with each of the plurality of encoding algorithms generates a different encoded value;

(b2) determining the threshold vector as a set of threshold values corresponding to each of the set of test levels, each threshold value representing a value between the ideal test level vectors generated in step (b1), and wherein one ideal test level vector is generated by encoding each of the set of test levels with a pulse code modulation (PCM) with A-law companding algorithm, and another ideal test level vector is generated by encoding each of the set of test levels with a PCM with $\mu$-law companding algorithm, and wherein each amplitude of the set of test levels is varied in accordance with simulated transmission characteristics of the communication channel such that the ideal test level vector generated by encoding each varying one of the set of test levels with the pulse code modulation (PCM) with A-law companding algorithm and with the PCM with $\mu$-law companding algorithm defines a corresponding vertex curve.

* * * * *

UNITED STATES PATENT AND TRADEMARK OFFICE
CERTIFICATE OF CORRECTION

PATENT NO. : 6,693,967 B1
DATED : February 17, 2004
INVENTOR(S) : Zhenyu Wang

It is certified that error appears in the above-identified patent and that said Letters Patent is hereby corrected as shown below:

Column 24,
Line 34, replace "test levels arc" with -- test levels are --.

Signed and Sealed this

Twenty-second Day of June, 2004

JON W. DUDAS
*Acting Director of the United States Patent and Trademark Office*